United States Patent [19]

Namba et al.

[11] 4,452,828

[45] Jun. 5, 1984

[54] PRODUCTION OF AMORPHOUS SILICON FILM

[75] Inventors: Masaharu Namba, Kanagawa; Mitsuru Yamauchi, Nagano; Toyoki Kazama, Kanagawa, all of Japan

[73] Assignee: Fuji Electric Company, Ltd., Kawasaki, Japan

[21] Appl. No.: 376,632

[22] Filed: May 10, 1982

[30] Foreign Application Priority Data

May 12, 1981 [JP] Japan .................................. 56-71024

[51] Int. Cl.³ .......................... B05D 3/04; B05D 3/14
[52] U.S. Cl. ......................................... 427/39; 427/38
[58] Field of Search ..................................... 427/38, 39

[56] References Cited

U.S. PATENT DOCUMENTS 4,225,222  9/1980  Kempter ........................... 427/39 X

FOREIGN PATENT DOCUMENTS 54-78135  10/1978  Japan .

OTHER PUBLICATIONS

Rusler et al., "LCVD-Type Plasma Enhanced Deposition System", Solid State Technology, vol. 22, pp. 88–92, (Dec. 1979).

Primary Examiner—James R. Hoffman
Attorney, Agent, or Firm—Brumbaugh, Graves, Donohue & Raymond

[57] ABSTRACT

Disclosed is an production method for plasma chemical vapor deposition (CVD) of amorphous silicon films providing improved throughput and film yield. According to the present invention, a glow discharge is generated in a reaction chamber containing a gaseous silicon-containing compound, such as monosilane ($SiH_4$) or tetraflourosilane ($SiF_4$), by the imposition of an electric field between a pair of spaced-apart electrodes within the chamber. The electric field is established by connecting an appropriate DC or high frequency driving voltage to one of the pair of electrodes and ground potential to the other. In the case where a high frequency driving voltage is used, connection to the driven electrode is made through a coupling capacitor, and the frequency of the driving voltage is selected such that a DC potential develops between the pair of electrodes. Substrates on which amorphous silicon films are to be deposited are positioned adjacent to each one of the electrodes, and the connections for the driving voltage and ground to the electrodes are periodically reversed during film deposition. In an alternative embodiment of the invention, multiple pairs of electrodes are arranged within the reaction chamber.

2 Claims, 6 Drawing Figures

PRODUCTION OF AMORPHOUS SILICON FILM

BACKGROUND OF THE INVENTION

Detail Description of the Invention

This invention relates to a method of producing an amorphous Si film by using plasma CVD (Chemical Vapor Deposition) techniques.

The amorphous Si films have been used as solar cells or semiconductor layers of photosensitive materials for electrophotography, and have been produced by plasma CVD techniques in general, that is, by decomposing monosilane ($SiH_4$) or tetrafluorosilane ($SiF_4$) by means of low pressure glow discharge. As techniques for generating the glow discharge, there have been proposed a DC type for generating the discharge by arranging electrodes within a vacuum reaction chamber, or a condenser coupling type due to high frequency electric field and an inductive coupling type for generating the discharge by arranging a high frequency coil outside the reaction chamber. However, since it is difficult in the inductive coupling type to establish the uniform electric field, the techniques for arranging electrodes within the reaction chamber have been mostly adopted in industrial plasma CVD equipment. In this case, one electrode acts as an anode and the other acts as a cathode by self-bias in the condenser coupling type which also includes a high frequency electric field of AC voltage with superimposed DC voltage as well as the high frequency electric field. FIG. 1 shows conceptually a reaction chamber 3 having parallel-plate electrodes 1,2. A reaction gas 5 is introduced into the chamber 3 through a supply pipe 6, while vacuum exhausting it through an exhaust pipe 4, and the glow discharge is generated by applying DC voltage between electrodes 1 and 2 through a power source 7, or by applying thereto DC high frequency voltage so that the electrode 1 grounded between electrodes 1 and 2 becomes positive and the electrode 2 becomes negative. In this case, the production of the amorphous Si film is not carried out simply by the electric field, but also takes part adsorption and decomposition reactions of the electrode surface. Therefore, positive Si ions generated by the decomposition of the reaction gas due to the plasma are not deposited on the electrode 2 of the cathode, but also deposited on the electrode 1 of the anode. A large quantity of Si ions is properly deposited on the cathode as compared with the anode but the deposition amount of Si ions on the anode is not disregarded. When a high density amorphous Si film is deposited on a substrate which is placed on the cathode 2 and is heated to about 200° C. by a heater (not shown), the Si film deposited on the anode 1 is entirely useless to decrease the yield.

FIG. 2 shows a manufacturing apparatus for producing an amorphous Si film, used for a photosensitive material for electrophotography, on a cylindrical substrate. A rotatable column-shaped support 8 is provided on a base, opposing to a semi-circular anode 11. If a voltage is applied through a power source 7 to a heated cylindrical substrate 12 formed on the support 8 by using the substrate 12 as a cathode, Si film deposited on an anode 11 is useless to reduce the yield.

SUMMARY OF THE INVENTION

It is an object of the present invention to provide an improved method of producing an amorphous Si film with high yield formed by DC type or condenser coupling type by using a reaction gas containing a Si compound.

The object is accomplished by arranging a heated substrate on anode and cathode electrodes and properly reversing the polarity of an applied voltage when an amorphous Si film is deposited on the substrates by applying a voltage between opposing electrodes arranged within a reaction chamber to decompose a Si compound by the glow discharge.

DETAILED DESCRIPTION

Figure 1:
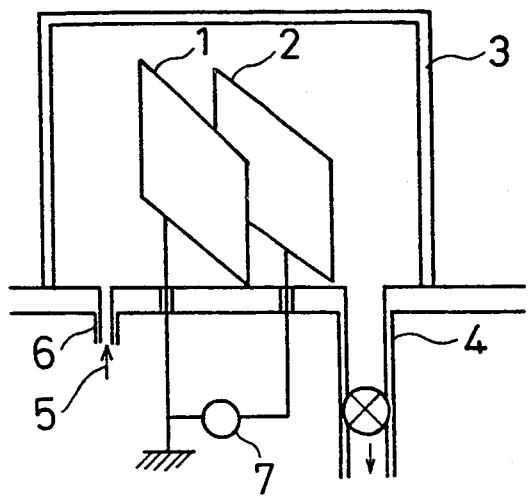
FIGS. 1 and 2 are schematic representations of known apparatus for producing amorphous Si film.

Preferred embodiments of the invention will now be described with accompanying drawings. In the drawings, the same numerals are rendered to common portions with FIGS. 1 and 2. In FIG. 3, parallel-plate electrodes 21, 22 similar to those in FIG. 2 includes a heater respectively. A metal substrate 9, for example, is supported on the surface of electrodes. When a high frequency or DC voltage is applied between electrodes 21 and 22 through a power source while vacuum exhausting the reaction chamber 3 and introducing the reaction gas 5, anode film and cathode film of amorphous Si are deposited on both substrates 9 heated to about 200° C. However, since the properties of the films are different to some extent with respect to the anode film and the cathode film, the film properties formed on the substrates 9 are made uniform by reversing the polarity of the applied voltage in the film production process. When the polarity is reversed, the earthing portion 10 must be changed according to it. Films with uniform properties may be produced when the reverse of the polarity is repeatedly carried out. The electrodes 21,22 may be used as substrates of the amorphous Si film instead of fixing the substrate 9 on the electrodes 21,22.

Figure 2:
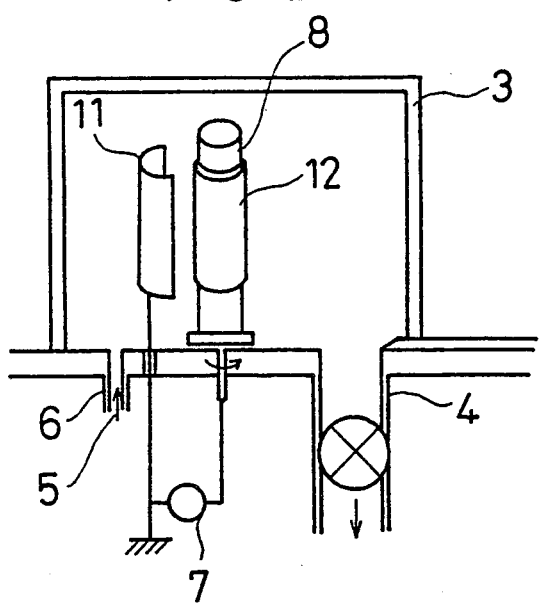
Figure 3:
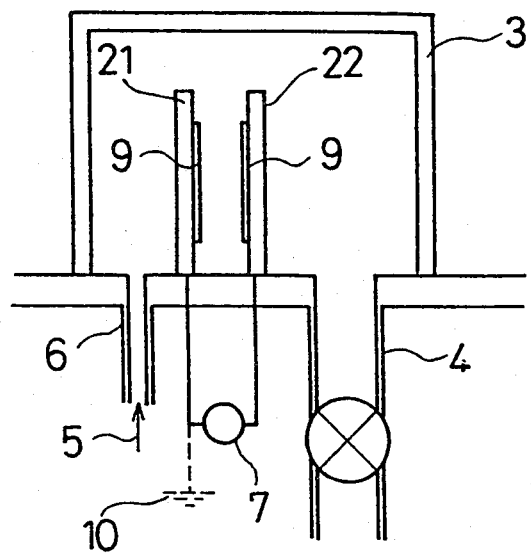
FIGS. 3 and 4 are schematic representations of apparatus for producing amorphous Si film in accordance with the present invention.
Figure 4:
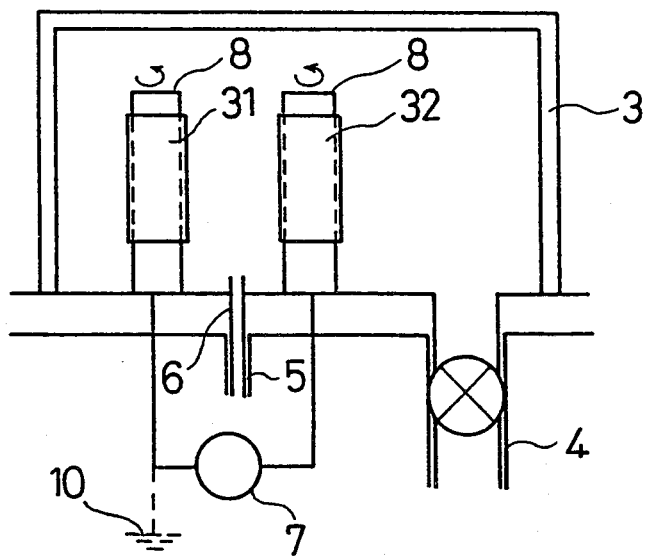

FIG. 4 shows a manufacturing apparatus for producing an amorphous Si film, used for a photosensitive material for electrophotography, on a cylindrical substrate similar to FIG. 2. Cylindrical substrates 31,32 are fixed on column-shaped supports 8 rotating around two parallel axes and being heated. The reaction gas is introduced into the vacuum exhausted reaction chamber 3. The voltage is then applied between substrates 31 and 32 through the supports 8 by the power source 7 to generate the glow discharge. When the polarity of the voltage is reversed and the earthing portion 10 is then changed, anode film and cathode film are alternately deposited on the substrates 31,32 to provide amorphous Si films having uniform properties.

Figure 5:
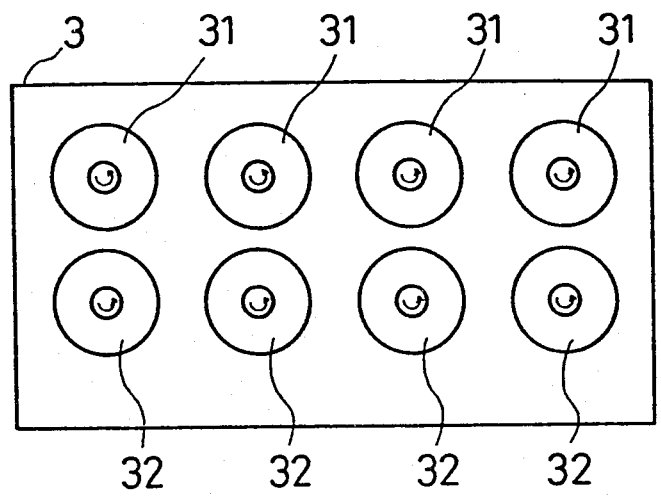
FIGS. 5 and 6 are plan views of alternative apparatus for producing amophous Si film in accordance with the present invention.

FIG. 5 shows a manufacturing apparatus for producing amorphous Si films on a number of cylindrical substrates at the same time. In this case, the voltage is applied between substrates 31 placed in one row and substrates 32 placed another row, which are heated and rotated around vertical axes. Mixed films, composed of anode films and cathode films, with uniform properties are then produced on respective cylindrical substrates 31, 32 by reversing the polarity. Therefore, such a process is available for mass production of photosensitive materials.

Figure 6:
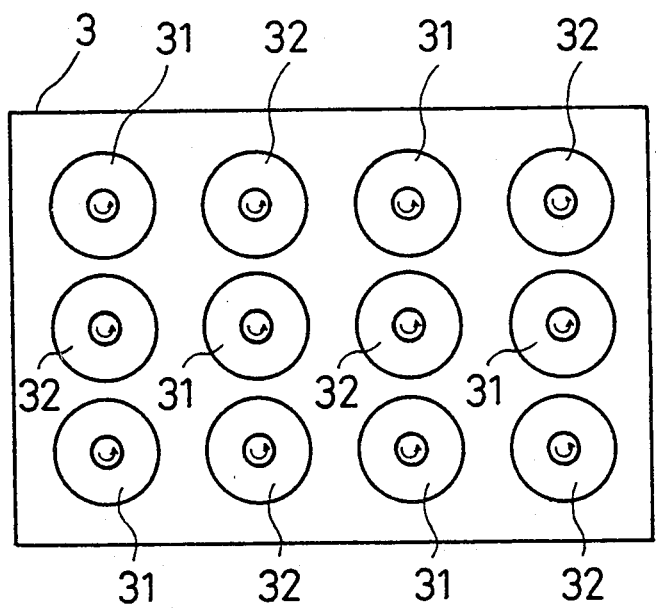

FIG. 6 shows another embodiment for producing amorphous Si films on a number of cylindrical substrates at the same time similar to FIG. 5. Substrates 31, to which the voltage with one polarity is applied, and substrates 32, to which the voltage with another polarity is applied, are zigzag arranged. Accordingly, the film deposition rate and the uniformity of amorphous Si films deposited on substrates are further improved because the glow discharge is uniformly generated in the reaction chamber.

Accordingly to the present invention, the voltage applied between electrodes is reversed and the mixed films of anode and cathode films having uniform properties are formed on heated substrates in DC or condenser coupling type fabrication process for making amorphous Si films. Therefore, the yield of Si from the reaction gas will be improved and it will be more effective to reduce the cost of solar cells or photosensitive materials for electrophotography using such amorphous Si films because anode film and cathode film can be employed and useless Si deposited on one electrode (particularly anode) can be utilized. In addition, the present invention will be effectively applicable to production of finely crystallized amorphous Si films obtained by the increase of input in the similar plasma CVD techniques.

We claim:

1. A method for producing an amorphous Si film on a substrate positioned adjacent to one of a pair of spaced-apart electrodes situated within a reaction chamber, the method comprising the steps of:
   heating the substrate;
   introducing a gaseous Si compound into the reaction chamber;
   generating a glow discharge within the reaction chamber by imposing an electric field between the pair of electrodes, the electric field being established by applying an appropriate driving voltage to one of the pair of electrodes and ground to the other; and
   reversing the application of the driving voltage and ground to the electrodes at least once during the production of the film.

2. A method for producing an amorphous Si film according to claim 1 wherein the reversing of the application of the driving voltage and ground to the electrodes is repeatedly carried out during the production of the film.

* * * * *